United States Patent
Moll et al.

(10) Patent No.: US 7,245,005 B2
(45) Date of Patent: Jul. 17, 2007

(54) LEAD-FRAME CONFIGURATION FOR CHIPS

(75) Inventors: Rainer Moll, Graz (AT); Joachim Heinz Schober, Graz (AT)

(73) Assignee: NXP B.V., Eindhoven (NL)

( * ) Notice: Subject to any disclaimer, the term of this patent is extended or adjusted under 35 U.S.C. 154(b) by 39 days.

(21) Appl. No.: 10/478,269

(22) PCT Filed: May 16, 2002

(86) PCT No.: PCT/IB02/01734
§ 371 (c)(1),
(2), (4) Date: Nov. 17, 2003

(87) PCT Pub. No.: WO02/095673
PCT Pub. Date: Nov. 28, 2002

(65) Prior Publication Data
US 2004/0174690 A1    Sep. 9, 2004

(30) Foreign Application Priority Data
May 17, 2001    (EP)    ................... 01890149

(51) Int. Cl.
*H01L 23/495*    (2006.01)

(52) U.S. Cl. .................................... 257/676
(58) Field of Classification Search ........ 257/666–679, 257/E33.66, E23.141, E23.041, E23.042, 257/620, 621
See application file for complete search history.

(56) References Cited

U.S. PATENT DOCUMENTS

| | | | | |
|---|---|---|---|---|
| 5,005,282 A | * | 4/1991 | Rose | ............................ 29/827 |
| 5,826,328 A | | 10/1998 | Guindon et al. | |
| 5,867,895 A | * | 2/1999 | Van Beneden et al. | ........ 29/827 |
| 6,072,228 A | * | 6/2000 | Hinkle et al. | ............... 257/666 |
| 6,114,756 A | * | 9/2000 | Kinsman | ..................... 257/676 |
| 6,198,044 B1 | * | 3/2001 | Venambre et al. | .......... 174/52.4 |

FOREIGN PATENT DOCUMENTS

WO    WO 00 30210    5/2000

* cited by examiner

*Primary Examiner*—Nathan W. Ha

(57) ABSTRACT

The invention relates to a lead-frame configuration with a frame base and multiplicity of lead-frames connected with the frame base, of which each lead-frame is intended to hold a chip, where each lead-frame has two connection plates of which each is intended to connect with a connection of a chip, where the two connection plates of each lead-frame delimit a bridging zone which can be bridged using a chip.

20 Claims, 3 Drawing Sheets

LEAD-FRAME CONFIGURATION FOR CHIPS

The invention relates to a lead-frame configuration with a frame base and multiplicity of lead-frames connected with the frame base, of which each lead-frame is intended to hold a chip, where each lead-frame has two connection plates of which each is intended to connect with a connection of a chip, where the two connection plates of each lead-frame delimit a bridging zone which can be bridged using a chip.

BACKGROUND

Such a lead-frame configuration is known from patent document U.S. Pat. No. 5,005,282 A. With the known lead-frame configuration, for each lead-frame in the bridging zone provided between two connection plates, there is a holder section of the lead-frame concerned mainly intended to hold a chip and the chip connected with the lead-frame is also embedded in a casting compound with which also the two connection plates and the holder section between the two connection plates are mechanically connected together. Because of this structure there is a relatively large height in a direction vertical to the plane of the lead-frame. Also in the known design the problem arises that the holder section lying between the two connecting plates requires a certain minimum space, which is disadvantageous in more and more applications and in particular for connecting chips that are as small as possible with a lead-frame in flip-chip technology or connecting the chip connections of this chip with the connection plates of a lead-frame in flip-chip technology.

SUMMARY OF THE INVENTION

It is an object of the invention to eliminate the difficulties described above and to realize an improved lead-frame configuration.

To achieve the above mentioned object, in a lead-frame configuration according to the invention in which no chips are yet provided, features according to the invention are provided so that such a lead-frame configuration according to the invention can be characterized in the following manner:

Lead-frame configuration designed strip-like with a frame base and a multiplicity of lead-frames connected with the frame base and lying next to each other in the strip's longitudinal direction, of which each lead-frame is intended to hold a chip, where each lead-frame has two connection plates and between each connection plate and the frame base is provided at least one connecting web, and where each connecting plate is intended to connect with a connection of a chip and where the two connecting plates of each lead-frame delimit a bridging zone which can be bridged using a chip, and where the two connecting plates of each lead-frame abut each other directly without an intermediate section of lead-frame and delimit an air gap as a bridging zone.

To achieve the above mentioned object, in a lead frame configuration according to the invention in which each lead-frame has a chip and each lead-frame is still connected electrically conductively with the frame base, features according to the invention are provided so that such a lead-frame configuration according to the invention can be characterized in the following manner:

Lead-frame configuration designed strip-like with a frame base and a multiplicity of lead-frames connected with the frame base and lying next to each other in the strip's longitudinal direction, of which each lead-frame is fitted with a chip, where each lead-frame has two connection plates and between each connection plate and the frame base is provided at least one connecting web, and where each connecting plate is connected with a connection of a chip and where the two connecting plates of each lead-frame delimit a bridging zone bridged by means of a chip, and where the two connecting plates of each lead-frame abut each other directly without an intermediate frame section and delimit an air gap as a bridging zone.

To achieve the above mentioned object, in a lead frame configuration according to the invention in which each lead-frame is fitted with a chip and each lead-frame is no longer electrically conductively connected with the frame base, features according to the invention are provided so that such a lead-frame configuration according to the invention can be characterized in the following manner:

Lead-frame configuration designed strip-like with a frame base and with a multiplicity of lead-frames connected with the frame base and lying next to each other in the strip's longitudinal direction, of which each lead-frame is fitted with a chip, where each lead-frame has two connection plates and between each connection plate and the frame base was originally provided at least one connecting web and where the originally provided connecting webs have been disabled, and where each connecting plate is connected with a connection of a chip and where the two connecting plates of each lead-frame delimit a bridging zone bridged by means of a chip and where the two connecting plates of each lead-frame about each other directly without an intermediate frame section and delimit an air gap as a bridging zone, and where for the lead-frames lying next to each other in the strip's longitudinal direction a connecting strip is provided running in the strip's longitudinal direction which is connected both with the frame base and with each of the frames lying next to each other in the strip's longitudinal linear direction.

The provision of the features according to the invention allows, in an easily implementable and constructionally simple manner, the lead-frame according to the invention to have a particularly compact and space-saving design at least in the area in which a chip can be or is connected with the lead-frame, and that in particular the distance between two connecting plates of this lead-frame, which connecting plates can be or are bridged by means of a chip is particularly small, which offers the great advantage that the distance between two chip connections each of which must be or is connected with such a lead-frame can be very small, which is true in the case of a particularly small chip which because of constant miniaturization is more and more common. In other words a lead-frame configuration according to the invention is ideally suitable in particular to hold very small chips with particularly small distances between chip connections which must be connected with the lead-frame of the frame configuration in flip-chip technology. A further great advantage of a lead-frame configuration according to the invention is that it is not necessary to embed the chip connected with the lead-frame into the casting compound, which means that a solution with a particularly small height can be achieved.

In the lead-frame configuration according to the invention the air gap provided between two connecting plates as a bridging zone can be designed so as to be rectilinear and run parallel to the strip's longitudinal direction of the lead-frame configuration. It has however proved very advantageous if the air gap is provided obliquely to the strip's longitudinal direction, where it has also proved particularly advantageous if the air gap is designed essentially S-shaped. This design is advantageous both with regard to the mechanical stress distribution in the bridging zone and with regard to the maximum flexibility in relation to the possible positions of the chip connections of the chips.

These and other aspects of the invention are apparent from the examples below and will be explained using these examples.

BRIEF DESCRIPTION OF THE INVENTION

The invention will be further described with reference to three examples of embodiments shown in the drawings to which however the invention is not restricted.

DETAIL DESCRIPTION

Figure 1:
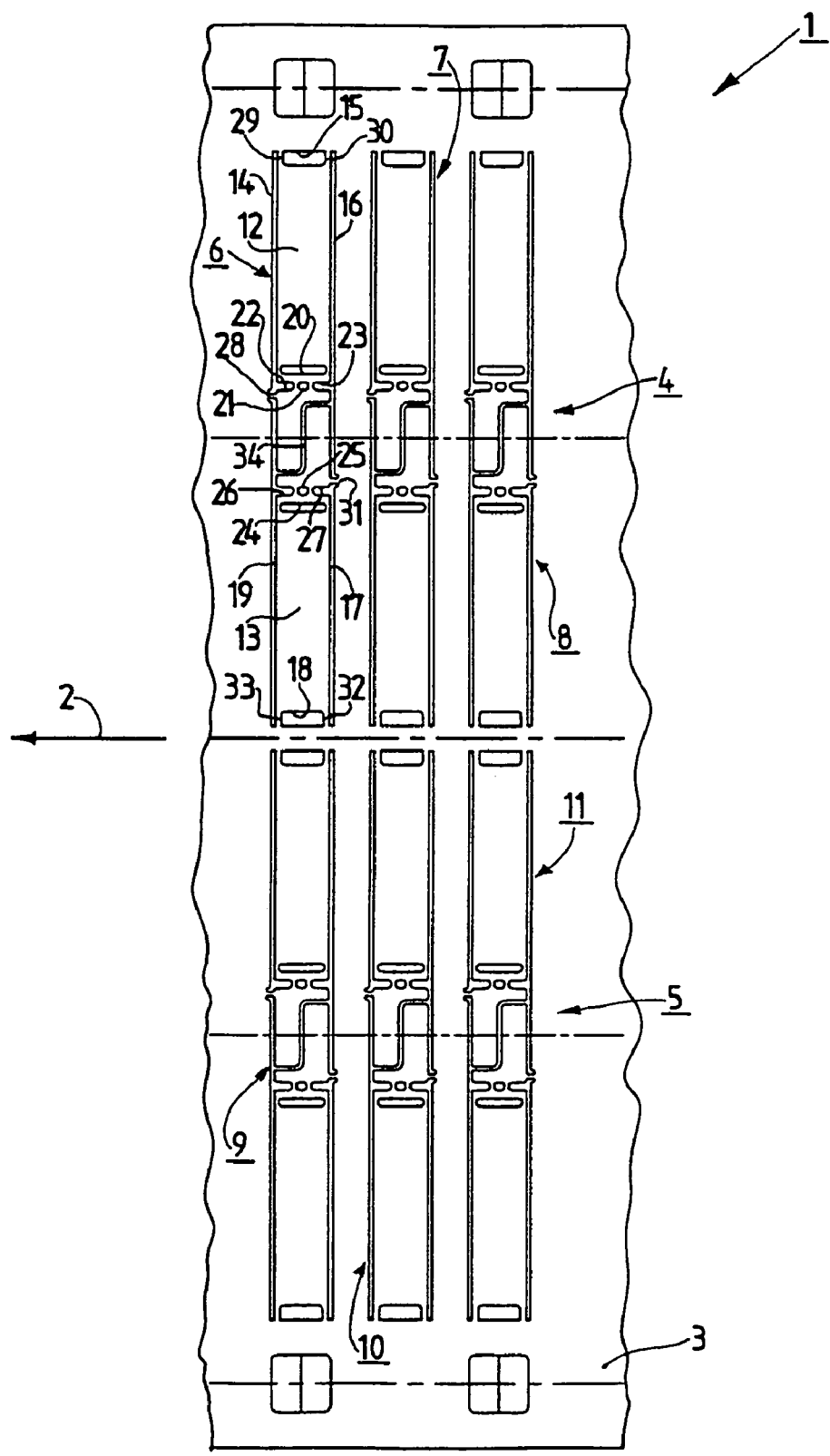
FIG. 1 shows in a plan view a part of a lead-frame configuration according to an example of the invention in which lead-frame configuration with the lead-frames shown no chips are yet connected.

FIG. 1 shows a lead-frame configuration 1 in part. The lead-frame configuration 1 is designed strip-like and has a longitudinal direction of the strip that is indicated in FIG. 1 with an arrow 2. The lead-frame configuration 1 has a frame base 3. Connected with the frame base 3 are a multiplicity of lead-frames lying next to each other in the longitudinal direction of the strips 2. In the present case the lead-frames are arranged in two rows 4 and 5. Of the total lead-frames provided, FIG. 1 shows only six lead-frames 6, 7, 8, 9, 10 and 11 where lead-frames 6, 7 and 8 belong to the first row 4 and lead-frames 9, 10 and 11 to the second row 5. Each lead-frame 6 to 11 is intended to hold a chip. In the lead-frame configuration 1 according to FIG. 1, the chips are not yet connected with the lead-frame configuration 1 or with lead frames 6 to 11 of this configuration 1.

The structure of all lead-frames 6 to 11 is described in more detail below where this description is given only using the first-mentioned lead-frame 6.

Each lead-frame 6 to 11, i.e. also lead-frame 6, has two connecting plates 12 and 13. Connecting plates 12 and 13 are separated from the frame base 3 by a first narrow air gap 14 and a first passage 15 and a second narrow air gap 16 and a third narrow air gap 17 and a second passage 18 and a fourth narrow air gap 19. In the first connecting plate 12 are provided a full slot 20 and next to this a hole 21 and two half slots 22 and 23, where the first half slot 22 opens into the first narrow air gap 14 and the second half slot 23 into the second narrow air gap 16. In the second connecting plate 13 is also provided a full slot 24 and next to this a hole 25 and two half slots 26 and 27, of which the first half slot 26 opens into the fourth narrow air gap 19 and the second half slot 27 into the third narrow air gap 17. As a result of providing the narrow air gaps 14, 16, 17 and 19 and passages 15 and 18, it is achieved that between the first connecting plate 12 and the frame base 3 lie a total of three connecting webs 28, 29 and 30, by means of which the first connection plate 12 is connected both mechanically and electrically conductively with the frame base 3. In a similar manner, between the second connecting plate 13 and the frame base 3 are provided three further connecting webs 31, 32 and 33 by means of which the second connecting plate 13 is connected with a frame base 3 both mechanically and electrically conductively. Each of the two connecting plates 12 and 13 is intended to connect with a chip connection of a chip.

The two connecting plates 12 and 13 of the lead-frame 6 delimit a bridging zone 34 which can be bridged using a chip. In the lead-frame configuration 1 the design is advantageously such that the two connecting plates 12 and 13 of the lead-frame 6 and hence of all other lead-frames 7, 8, 9, 10 and 11 abut each other directly without an intermediate section of the lead-frame 6 or the other lead-frames 7 to 11 and delimit a narrow air gap 34 as a bridging zone 34. In the design here the air gap 34 is provided so as to extend obliquely to the longitudinal direction of the strips 2. The air gap 34 is also essentially S-shaped as is clear from the FIG. 1.

Figure 2:
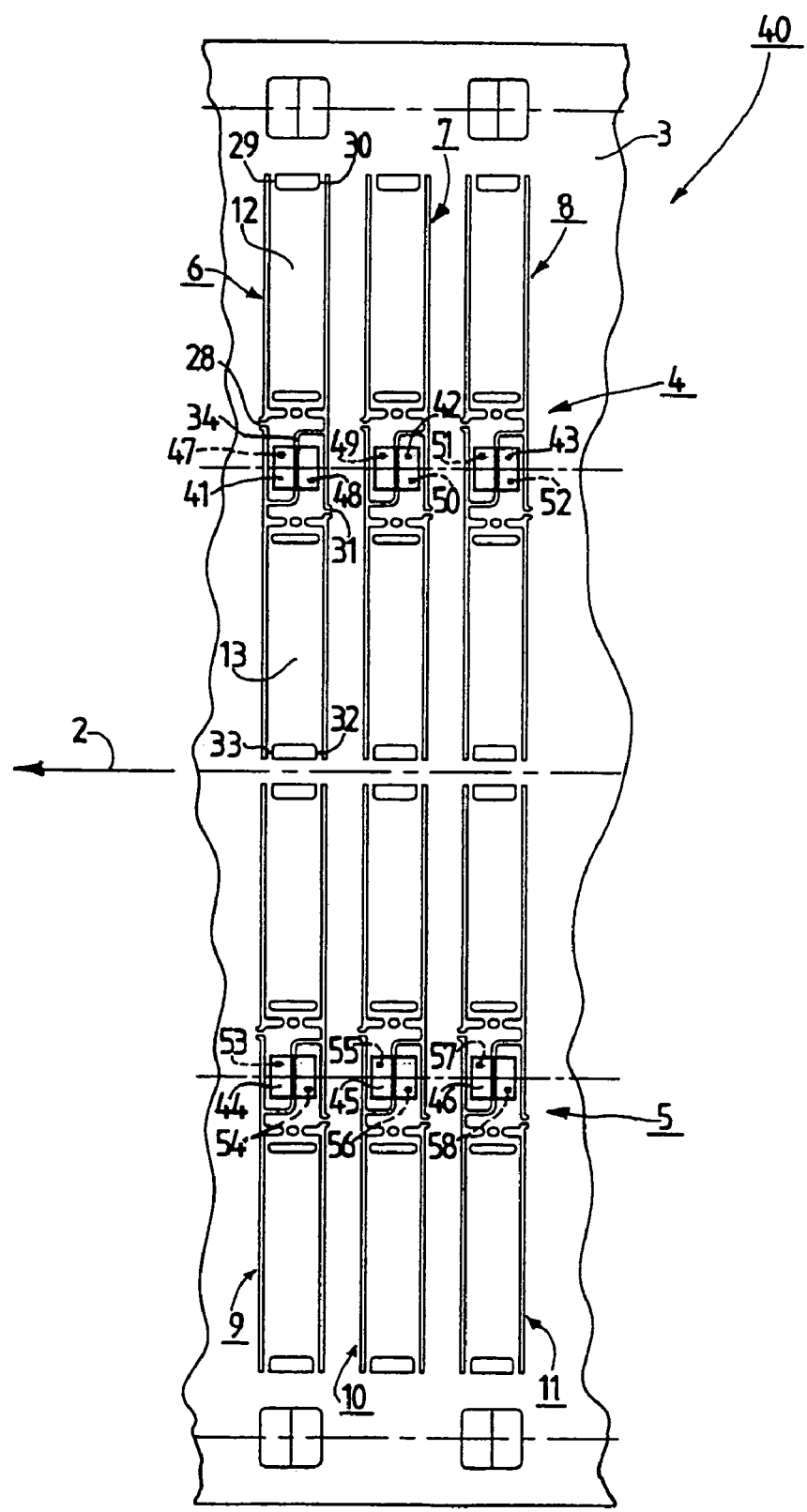
FIG. 2 shows in a similar manner to FIG. 1 part of a lead-frame configuration according to an example of the invention in which lead-frame configuration with the lead-frames shown a chip is already connected, and the lead-frame is shown still electrically conductively connected to the frame base.

FIG. 2 shows a lead-frame configuration 40 which is obtained by refining the lead-frame configuration 1 according to FIG. 1 and differs from the configuration 1 in FIG. 1 in that in the lead-frame configuration 40 in FIG. 2, a chip 41, 42, 43, 44, 45, 46 is connected with each lead-frame 6 to 11. The chips 41 to 46 are connected with their lead-frames 6 to 11 using "flip-chip technology", which means that each chip 41 to 46 with in this case its two chip connections 47, 48 and 49, 50 and 51, 52 and 53, 54 and 55, 56 and 57, 58 is placed in rotated position on the two connecting plates 12 and 13 of each lead-frame 6 to 11 and connected electrically conductively. The connection between the chip connections 47 to 58 and the connection plates 12 to 13 of each lead-frame 6 to 11 is achieved in this case using a thermo-compression process. Evidently the connection between the chip connections 47 to 58 and connecting plates 12 to 13 of each lead-frame 6 to 11 can also be made with other processes known per se.

Figure 3:
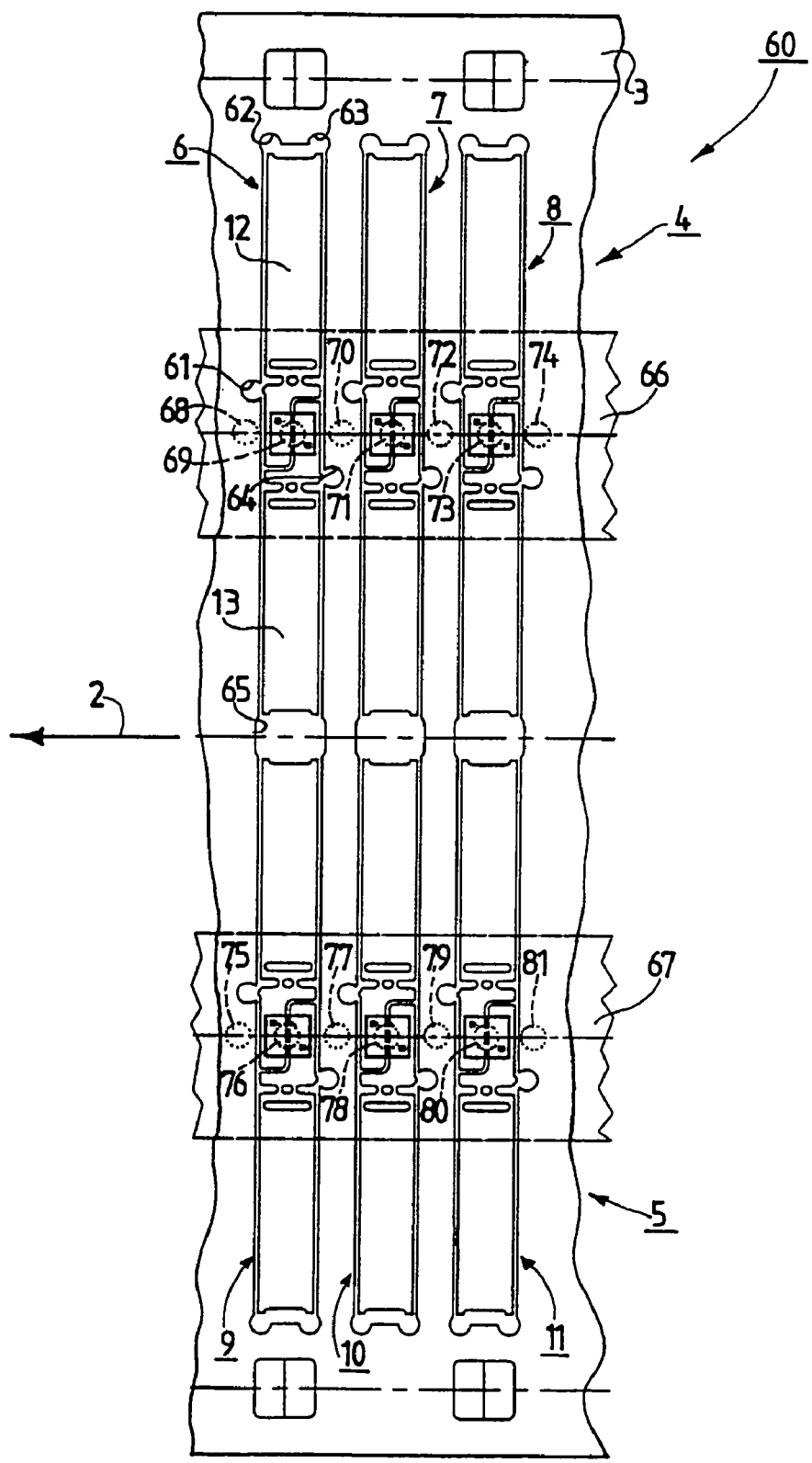
FIG. 3 shows in a similar manner to FIGS. 1 and 2 a lead-frame configuration according to an example of the invention in which lead-frame configuration with its lead-frames a chip is already connected and the lead-frames are electrically insulated from the frame base.

FIG. 3 shows a further lead-frame configuration 60 which is achieved by refining the lead-frame configuration 40 in FIG. 2 and differs from the configuration 40 in FIG. 2 in that the lead-frames 6 to 11 and the chips 41 to 46 connected with these frames 6 to 11 are electrically insulated from the frame base 3. This is achieved in that the connecting webs 28, 29, 30 and 31, 32, 33 originally provided between the connecting plates 12 and 13 and the frame base 3 are disabled, in that those areas in which the said connecting webs 12 to 33 were provided are now provided with passages 61, 62, 63, 64 and 65 produced by a punching process.

If the passages 61 to 65 were produced without taking precautions this would mean that the two connecting plates 12 and 13 of each lead-frame 6 to 11 and the chips 41 to 46 connected with the two connecting plates 12 and 13 would have no further mechanical connection with the frame base 3, with the result that the two connecting plates 12 and 13 of each lead-frame 6 to 11 and the chips 41 to 46 connected with these would fall out of the frame base 3. To prevent this, in the lead-frame configuration 60 two connecting straps 66 and 67 are provided in the longitudinal direction 2 of the strip. The two connecting straps 66 and 67 are connected both with the frame base 3 and with each lead-frame 6 to 11 via connecting zones. These connecting zones are shown diagrammatically in FIG. 3 with circles 68, 69, 70, 71, 72, 73, 74, 75, 76, 77, 78, 79, 80, 81 indicated by dotted lines. Connecting zones 68 to 81 are produced of limited area and thus do not extend over the entire surface area of the connecting straps 66 and 67. Connecting straps 66 and 67 here consist of plastic and connecting zones 68 to 81 are produced by localized warming or heating of the connecting straps 66 and 67 made of plastic. Thus connecting zones 68 to 81 can be disabled as required, as is described in more detail below.

As, in the frame configuration 60 according to FIG. 3, no electrically conductive connection remains between connecting plates 12 and 13 of each lead-frame 6 to 11 and frame base 3, a test process can now be performed. In such a test process a contact electrode of a test device is brought into electrical connection with each connecting plate 12 and 13, whereupon using the test device a test is performed on the chips 41 to 46 connected to the plates 12 and 13.

The lead-frame configuration 60 shown in FIG. 3 can be passed on for further processing after completion of the necessary test procedure. For example the lead-frame configuration 60 according to FIG. 3 can be passed by the manufacturer of this lead-frame configuration 60 to a manufacturer of contactless communicating chip cards or a manufacturer of contactless RF labels or RF tags. The lead-frame configuration 60 according to FIG. 3 is advantageously passed on in roll form, which is particularly advantageous with regard to the easiest and most efficient transport.

In the company in which the lead-frame configuration 60 is processed further, the connecting straps 66 and 67 together with the connecting plates 12 and 13 connected with the connecting straps 66 and 67 via connecting zones 69, 71, 73, 76, 78 and 80, and together with the chips 41 to 46, are separated from the frame base 3, and in this separation connecting zones 68, 70, 72, 74, 75, 77, 79 and 81 are disabled as the parts of the connecting straps 66 and 67 in these connecting zones remain on the frame base 3. These parts of the connecting straps 66 and 67 can however also be separated from the frame base 3. Consequently in the company in which the lead-frame configuration 60 is processed further, the connecting plates 12 and 13 connected with the first connecting strap 66 together with chips 41 to 43, and the connecting plates 12 and 13 connected with the second connecting strap 67 together with chips 44 to 46, are available for further processing. During this further processing a unit consisting of two connecting plates 12 and 13 and a chip 41 to 46, said unit often being known as a module, is inserted or placed in the end product to be produced. Subsequently the two connecting plates 12 and 13 of each module are connected for example with the two connection contacts of a transfer coil of the end product concerned. After this connection of connecting plates 12 and 13 with the contacts of the transfer coil for example, the relevant connecting strap 66 is pulled off connecting plates 12 and 13, whereby then the connecting zones 69, 71 and 73 or 76, 78 and 80 are disabled as the areas of connecting straps 66 and 67 lying within these connecting zones 69, 71, 73, 76, 78 and 80 remain connected with the connecting plates 12 and 13. These areas of the connecting straps 66 and 67 can however also be separated from the connecting plates 12 and 13.

It should here be pointed out that the connecting straps 66 and 67 and the connecting plates 12 and 13 connected with the connecting straps 66 and 67 via connecting zones 69, 71, 73, 76, 78 and 80 together with chips 41 to 46 need not necessarily be separated from the frame base 3 by the further processing company but this could be done by the manufacturer of the lead-frame configuration 60. For example this separation could take place after connecting the connecting straps 66 and 67 with frame base 3 and with connecting plates 12 and 13 and after producing the passages 61 to 65 with a punching process.

It should be stated that the units consisting each of two connecting plates 12 and 13 and a chip 41 to 46 could also be processed further using conventional "pick & place" technology. Here the units consisting of two connecting plates 12 and 13 and a chip 41 to 46 are removed individually from the frame base 3 in that either the connecting straps 66 and 67 are divided in the narrow air gaps 14, 16, 17 and 19 or the units consisting of the two connecting plates 12 and 13 and a chip 41 to 46 are removed from the connecting straps 66 and 67.

In the lead-frame configurations 1 and 40 and 60 described above, there is the great advantage that the two connecting plates 12 and 13 of each lead-frame 6 to 11 abut each other directly and are separated from each other only by a narrow air gap 34. This offers the great advantage that the bridging zone 34 formed by the narrow air gap 34 can also be bridged using a particularly small chip 41 to 46 in flip-chip technology in which the distances between the chip connections are very small. Thus the lead-frame configurations 1, 40 and 60 are excellently suited for co-operating with particularly small chips. A further advantage in the lead-frame configurations 40 and 60 according to FIGS. 2 and 3 is that with these configurations 40 to 60 it is not necessary to embed each chip 41 to 46 in a casting compound because the particularly narrow bridging zone 34 enables a sufficiently stable mechanical cohesion of the connecting plates 12 and 13 connected with the chip connections of each chip 41 to 46 to be obtained without casting compound and using only the chips 41 to 46 concerned.

The invention claimed is:

1. A lead-frame configuration, the lead-frame configuration being strip-like and having a longitudinal direction, with a multiplicity of lead-frames lying next to each other in the longitudinal direction, of which each lead-frame is intended to hold a respective chip, wherein each lead-frame has two connection plates, and wherein each connecting plate is intended to connect with a chip connection of each said respective chip and wherein the two connecting plates of each lead-frame delimit a bridging zone which can be bridged using each said respective chip, and wherein the two connecting plates of each lead-frame abut each other directly in delimiting the bridging zone.

2. A lead-frame configuration as claimed in claim 1, wherein the bridging zone runs, at least in part, obliquely to the longitudinal direction.

3. A lead-frame configuration as claimed in claim 1, wherein the bridging zone is substantially S-shaped.

4. A chip/lead-frame assembly, the assembly including a chip and a lead-frame configuration, the lead-frame configuration being strip-like and having a longitudinal direction, with a multiplicity of lead-frames lying next to each other in the longitudinal direction, of which each lead-frame has a respective chip, each respective chip having two chip connections, wherein each lead-frame has two connection plates, and wherein each connecting plate is connected with a chip connection of each said respective chip and wherein the two connecting plates of each lead-frame delimit a bridging zone bridged by means of each said respective chip, and wherein the two connecting plates of each lead-frame abut each other directly in delimiting the bridging zone.

5. A chip/lead-frame assembly as claimed in claim 4, wherein the bridging zone runs, at least in part, obliquely to the longitudinal direction.

6. A chip/lead-frame assembly as claimed in claim 4, wherein the bridging zone is substantially S-shaped.

7. A lead-frame configuration designed strip-like with a frame base and with a multiplicity of lead-frames connected with the frame base and lying next to each other in the strip's longitudinal direction, of which each lead-frame is fitted with a chip, where each lead-frame has two connection plates and between each connection plate and the frame base was originally provided at least one connecting web and where the originally provided connecting webs have been disabled, and where each connecting plate is connected with a chip connection of a chip and where the two connecting plates of each lead-frame dellmit a bridging zone bridged by means of a chip and where the two connecting plates of each lead-frame but each other directly without an intermediate section of the lead-frame and delimit an air gap as a bridging zone, and where for the lead-frames lying next to each other in the strip's longitudinal direction a connecting strap is provided running in the strip's longitudinal direction which is connected both with the frame base and with each of the frames lying next to each other in the strip's longitudinal direction.

8. A lead-frame configuration as claimed in claim 7, where the connecting strap is connected both with the frame base and with each of the lead-frames lying next to other in the strips longitudinal direction via a multiplicity of connecting zones which can be disabled.

9. A lead-frame configuration as claimed in claim 7, where the air gap runs obliquely with respect to the strip's longitudinal direction.

10. A lead-frame configuration as claimed in claim 7, where the air gap runs essentially S-shaped.

11. A lead-frame configuration, the lead frame configuration being strip-like in a longitudinal direction and having a plurality of lead-frames, each lead frame being disposed adjacent to at least one other lead frame in the longitudinal direction and being provided to support a chip having chip connections, the lead-frame configuration comprising: a lead-frame having two, connection plates, each said connecting plate providing for electrically conductive connection with a respective one of the chip connections and said connecting plates abutting directly in delimiting a bridging zone therebetween.

12. A lead-frame configuration as claimed in claim 11, wherein the bridging zone runs, at least in part, obliquely to the longitudinal direction.

13. A lead-frame configuration as claimed in claim 11, wherein the bridging zone is substantially S-shaped.

14. A lead-frame configuration as claimed in claim 11, wherein the bridging zone consists of an air gap.

15. A lead-frame configuration as claimed in claim 11, wherein the bridging zone is provided so as to be bridged by the chip in connecting the connecting plates with respective chip connections.

16. A lead-frame configuration as claimed in claim 11, wherein the two connecting plates abut each other by omitting to dispose any intermediate section of the lead frame between said two connecting plates.

17. A lead-frame configuration as claimed in claim 11, further comprising a frame base.

18. A lead-frame configuration as claimed in claim 17. further comprising at least one connecting web, each said connecting web being disposed between a respective connection plate and the frame base.

19. A lead-frame configuration as claimed in claim 17, wherein each respective connection plate is mechanically connected to the frame base, while maintaining electrical insulation therebetween.

20. A lead-frame configuration as claimed in claim 19, further providing at least one connecting strap, said connecting strap disposed in the longitudinal direction and being connected with the frame base and the lead frame of each respective connection plate.

* * * * *